(12) United States Patent
Ronda et al.

(10) Patent No.: US 9,153,723 B2
(45) Date of Patent: Oct. 6, 2015

(54) LUMINESCENT PHOTOVOLTAIC GENERATOR AND A WAVEGUIDE FOR USE IN A PHOTOVOLTAIC GENERATOR

(75) Inventors: Cornelis Reinder M. Ronda, Eindhoven (NL); Dirk Kornelis Gerhardus De Boer, Eindhoven (NL)

(73) Assignee: KONINKLIJKE PHILIPS N.V., Eindhoven (NL)

(*) Notice: Subject to any disclaimer, the term of this patent is extended or adjusted under 35 U.S.C. 154(b) by 607 days.

(21) Appl. No.: 13/139,360

(22) PCT Filed: Dec. 7, 2009

(86) PCT No.: PCT/IB2009/055539
§ 371 (c)(1),
(2), (4) Date: Jun. 13, 2011

(87) PCT Pub. No.: WO2010/067296
PCT Pub. Date: Jun. 17, 2010

(65) Prior Publication Data
US 2011/0240120 A1    Oct. 6, 2011

(30) Foreign Application Priority Data

Dec. 12, 2008   (EP) ..................................... 08171483

(51) Int. Cl.
*H02N 6/00* (2006.01)
*H01L 31/042* (2014.01)
(Continued)

(52) U.S. Cl.
CPC .............. *H01L 31/055* (2013.01); *C09K 11/02* (2013.01); *C09K 11/7776* (2013.01); *C09K 11/7792* (2013.01); *H01L 31/02168* (2013.01); *Y02E 10/52* (2013.01)

(58) Field of Classification Search
CPC ............ H01L 31/02322; H01L 31/055; H01L 2251/5376
USPC .................................................. 136/257, 247
See application file for complete search history.

(56) References Cited

U.S. PATENT DOCUMENTS 3,591,420 A * 7/1971 Streed ............................ 136/257
4,313,425 A   2/1982 Crackel
(Continued)

FOREIGN PATENT DOCUMENTS

EP        1710292 A2    11/2006
WO    WO2006088369 A2    8/2006

OTHER PUBLICATIONS

Quaal et al "Cadmium Selenide (CdSe) quantum dot-quantum mechanical model"s.*

(Continued)

*Primary Examiner* — Jeffrey T Barton
*Assistant Examiner* — Uyen Tran
(74) *Attorney, Agent, or Firm* — Larry Liberchuk (57) ABSTRACT

The present invention relates to a luminescent photovoltaic generator (1) and a waveguide for use in such a photovoltaic generator. The photovoltaic generator comprises a photovoltaic cell (4) and a waveguide comprising a transparent matrix (2) having particles of an inorganic luminescent material dispersed therein and/or an inorganic luminescent material disposed at at least one side thereof (6). The waveguide is associated with the photovoltaic cell (4), such that, in use, at least some of the light emitted from the luminescent material passes into the photovoltaic cell (4) to generate a voltage in the cell. In preferred embodiments, the inorganic luminescent material is a line emitter and the emission is due to a forbidden electronic transition within the material. The inorganic luminescent material may be selected from an inorganic phosphor, an inorganic fluorescent material and quantum dots, quantum rods and quantum core/shell systems. The photovoltaic generator (1) is an alternative to or an improvement upon known photovoltaic generators, which generally suffer from a lack of power yield per area.

16 Claims, 3 Drawing Sheets

(51) Int. Cl.
*H01L 31/055* (2014.01)
*C09K 11/02* (2006.01)
*C09K 11/77* (2006.01)
*H01L 31/0216* (2014.01)

(56) References Cited

U.S. PATENT DOCUMENTS

| | | | |
|---|---|---|---|
| 5,431,742 A | 7/1995 | Kleinerman | |
| 6,476,312 B1* | 11/2002 | Barnham | 136/247 |
| 6,744,960 B2* | 6/2004 | Pelka | 385/130 |
| 2002/0074035 A1 | 6/2002 | Gravisse | |
| 2003/0213514 A1 | 11/2003 | Ortabasi | |
| 2006/0120679 A1* | 6/2006 | Hyde | 385/129 |
| 2008/0041444 A1 | 2/2008 | Bendapudi | |
| 2008/0149165 A1* | 6/2008 | Hoeks et al. | 136/247 |
| 2009/0121615 A1* | 5/2009 | Le Toquin | 313/503 |
| 2010/0139749 A1 | 6/2010 | Mapel | |
| 2010/0139765 A1 | 6/2010 | Mapel | |
| 2010/0139769 A1 | 6/2010 | Mapel | |

OTHER PUBLICATIONS

Reisfeld R el al: "Nd<3+> and Yb<3+> germanate and tellurite glasses for fluorescent solar energy collectors" Chemical Physics Letters, North-Holland, Amsterdam, vol. 80, No. 1, May 15, 1981, pp. 178-183, XP026509890.

Ntwaeaborwa 0 M et al., "Photoluminescence of cerium-europium co-doped SiO2 phosphor prepared by a sol-gel process", Database Compendex [Online] Engineering Information, Inc., New York, NY, US; Apr. 2006, XP002569321.

Rossner W et al: "The conversion of high energy radiation to visible light by luminescent ceramics" IEEE Transactions on Nuclear Science USA, vol. 40, No. 4, Aug. 1993, pp. 376-379, XP002569320.

Gallagher et al., "Quantum dot solar concentrators: Electrical conversion efficiencies and comparative concentrating factors of fabricated devices", Solar Energy, Pergamon Press. Oxford, GB, vol. 81, No. 6, May 11, 2007, pp. 813-821, XP022071340.

Currie M J et al., "High-efficiency organic solar concentrators for photovoltaics", Science US, vol. 321, No. 5886, Jul. 11, 2008, pp. 226-228, XP002568964.

* cited by examiner

LUMINESCENT PHOTOVOLTAIC GENERATOR AND A WAVEGUIDE FOR USE IN A PHOTOVOLTAIC GENERATOR

FIELD OF THE INVENTION

The present invention relates to a luminescent photovoltaic generator and a waveguide for use in a photovoltaic generator.

BACKGROUND OF THE INVENTION

A photovoltaic generator is a device that generates electricity from light. There has been a constant effort over the past few years to increase the efficiency of photovoltaic generators. Traditional solar panels, having an array of solar cells, have become efficient to a point that commercialisation is now widespread. Such traditional panels nevertheless have their disadvantages. For example, to maximise power yield, they should be adapted to follow the sun as it crosses the sky. Additionally, the traditional panels do not generate electricity particularly well if the incident light is diffuse, for example on a cloudy day.

In an effort to overcome some of the problems associated with traditional panels, research has recently been carried out into developing photovoltaic generators that can be used in stationary systems and that can operate more efficiently when ambient light is diffuse. One type of photovoltaic generator that has been developed is a luminescent photovoltaic generator. This type of device includes a photovoltaic cell and an associated luminescent portion. The device is typically arranged such that incident light passes into the luminescent portion, at least some of the incident light being absorbed, then emitted and passed to the photovoltaic cell, where the light generates electricity. The luminescent emission of the light is typically in all directions, so that suitable reflectors ideally should be placed around sides of the luminescent portion to minimise loss of emitted light, and to guide as much of the emitted light to the photovoltaic cell. Luminescent photovoltaic generators, although promising in theory, have yet to reach an efficiency that allows them to be used commercially. There is a constant desire to improve efficiency of luminescent photovoltaic generators.

Recent research in the field has been focussed on the use of organic luminescent materials. This is exemplified in a paper by Currie et al in *Science*, 11 Jul. 2008, Vol. 321. no. 5886, pp. 226-228, entitled High-Efficiency Organic Solar Concentrators for Photovoltaics. This paper discloses organic luminescent solar concentrators for use in generating electricity with solar cells. The solar concentrators comprise a glass substrate having a thin film of an organic dye on a surface thereof. Two types of organic dye were used: 4-(dicyanomethylene)-2-t-butyl-6-(1,1,7,7-tetramethylju-lolidyl-9-enyl)-4H-pyran (DCJTB), a fluorescent dye, and platinum tetraphenyltetrabenzoporphyrin [Pt(TPBP)], a phosphorescent dye.

The organic luminescent solar concentrators disclosed in the paper mentioned above by Currie et al have fairly broad emission spectra, in common with most organic luminescent materials. With such materials, reflectors on the outside of the luminescent portion of the concentrators need to be able to reflect most, if not all, of the emitted light. On the side of the device on which light is incident, the reflector must allow incident light of an appropriate wavelength through to the luminescent material so that this light can be absorbed, but it must prevent emitted light from the luminescent material passing through the reflector, and instead reflect this, so that it can reach the solar cell. Such reflectors are termed light or wavelength filters. It can be costly to provide light filters that reflect across a broad range of wavelengths.

Organic luminescent materials also suffer from degradation over an extended period, particularly from incident UV light.

SUMMARY OF THE INVENTION

It would be desirable to provide an alternative or an improved photovoltaic generator to those disclosed in the prior art. It may be improved, for example, in terms of efficiency and/or cost of manufacture.

In a first aspect, the present invention provides a waveguide for use in a photovoltaic generator, the waveguide comprising a transparent matrix having (i) particles of an inorganic luminescent material dispersed therein and/or (ii) an inorganic luminescent material disposed at at least one side thereof.

In a second aspect, the present invention provides a photovoltaic generator comprising a photovoltaic cell and a waveguide comprising a transparent matrix having (i) particles of an inorganic luminescent material dispersed therein and/or (ii) an inorganic luminescent material disposed at at least one side thereof, wherein the waveguide is associated with the photovoltaic cell, such that, in use, at least some of the light emitted from the luminescent material passes into the photovoltaic cell to generate a voltage in the cell.

Inorganic luminescent materials have been found to be preferable over organic luminescent materials since they do not tend to degrade over an extended period. In addition, they allow, when based on energy transfer and/or inorganic materials doped with rare-earth or transition metal ions, a large Stokes Shift without resulting in substantial thermal quenching of the luminescence. Moreover, certain embodiments of the present invention, as described below, may be used with easy-to-fabricate interference filters, particularly embodiments in which the wavelength difference between excitation wavelength and emission wavelength is large and the emission line width is small. In an embodiment, as described below, photo-stable quantum particles, such as quantum dots, quantum rods or core shell systems, can be used in or as the inorganic luminescent material. Re-absorption can be minimised by using quantum particles with indirect emission transitions, using small and large quantum particles. In the case in which energy is transferred from small to large quantum particles the large quantum particles are present in small amounts to prevent re-absorption by the large quantum particles.

In an embodiment, the inorganic luminescent material has an absorption line width of 50 nm or more, an emission line width of 20 nm or less and a Stokes shift of 50 nm or more.

In an embodiment, the inorganic luminescent material has an absorption line width of 100 nm or more, an emission line width of 10 nm or less and a Stokes shift of 100 nm or more.

In an embodiment, the waveguide further comprises an interference filter disposed at at least one side transparent matrix, the interference filter (i) allowing transmission of light into the waveguide within the electromagnetic region that is absorbed by the inorganic luminescent material and (ii) selectively reflecting light within the electromagnetic region that is emitted from the inorganic luminescent material.

In an embodiment, the transparent matrix comprises a non-crystalline material and the inorganic luminescent material comprises a crystalline material.

In an embodiment, the inorganic luminescent material comprises a first species that absorbs light in the region of 300 nm to 1420 nm, and a second species that emits light at a greater wavelength than the first species absorbs, and energy transfer occurs between the first and second species, such that the inorganic luminescent material absorbs light in the region of 300 nm to 1420 nm, and emits at the greater wavelength, and the light at the greater wavelength is at an appropriate energy to generate a voltage in the photovoltaic cell. A species that absorbs light in the region of 300 nm to 1420 nm is a species that absorbs light in at least part of the region of 300 nm to 1420 nm; it need not absorb across the whole of this range. The wavelength of maximum absorption of the first species may lie within the region of 300 nm to 1420 nm.

In an embodiment, the inorganic luminescent material has a high wavelength absorption limit of $\lambda^a$, where $\lambda^a$ is a wavelength that corresponds to an energy that is 20% or more than the energy of the band gap in the photovoltaic cell.

In an embodiment, the inorganic luminescent material may comprises a plurality of types of first species that absorb at different wavelengths and a single type of second species that emits at a certain wavelength and the luminescent material is preferably a line emitter. This has been found to be advantageous in that it enables the material to have a broad absorption range, but emits substantially only at a single wavelength with a narrow band width. A plurality of different inorganic luminescent materials may be used in the device, the different materials having absorption over different wavelengths from one another, but having an emission peak that is the same or substantially the same (for example within about 20 nm) as one another, and preferably the inorganic luminescent materials are line emitters. As explained below, this allows relatively inexpensive interference filters that are selectively reflective only for the emitted wavelengths to be used, which saves on the cost of manufacture of the photovoltaic device.

In an embodiment, the inorganic luminescent material comprises an inorganic phosphor. The inorganic luminescent material may comprise a plurality of types of inorganic phosphor.

In an embodiment, the inorganic phosphor comprises an inorganic host material containing first and second species, wherein the first species is an ion selected from $Ce^{3+}$, $Eu^{2+}$ or $Yb^{2+}$ and the second species is an ion selected from a rare earth ion and a transition metal ion.

In an embodiment, the inorganic phosphor comprises $Gd_3Ga_5O_{12}$; Ce, Cr. In an embodiment, the inorganic luminescent material comprises an inorganic fluorescent material.

In an embodiment, the inorganic fluorescent material comprises an inorganic host material containing first and second species, the concentration of the first species in the inorganic host material is greater than the concentration of the second species and the second species is present in the inorganic host material in an amount of 0.5 or less mole %.

In an embodiment, the inorganic fluorescent material comprises $CaAlSiN_3$; Ce, Eu.

In an embodiment, the inorganic luminescent material comprises quantum particles, as described herein. In an embodiment, the first and second species comprise, independently, quantum particles, which may be selected from quantum dots, quantum rods and quantum core/shell particles.

BRIEF DESCRIPTION OF THE DRAWINGS

Like reference numbers refer in the Figures to identical or similar components.

DETAILED DESCRIPTION OF EMBODIMENTS

The present invention provides a waveguide for use in a photovoltaic generator, and a photovoltaic generator as described above.

Materials for Use in the Waveguide and Photovoltaic Cell

As described herein, the transparent matrix has (i) particles comprising an inorganic luminescent material dispersed therein and/or (ii) an inorganic luminescent material disposed at at least one side thereof. If the transparent matrix has particles comprising an inorganic luminescent material dispersed therein and an inorganic luminescent material disposed at at least one side thereof, the inorganic luminescent material of the particles and the material disposed at at least one side of the transparent matrix may be the same or different materials, and may be as described herein. The particles may comprise, consist essentially of or consist of the inorganic luminescent material. If the particles consists essentially of the inorganic luminescent material, preferably less than 5 wt %, more preferably less than 2 wt %, most preferably less than 1 wt % of other materials are present in the particles.

The inorganic luminescent material preferably absorbs light in a region of the electromagnetic spectrum, optionally selected from the UV and/or visible and/or infrared region of the electromagnetic spectrum, and emits light at a greater wavelength. The light at the greater wavelength is at an appropriate energy to generate a voltage in the photovoltaic cell. The inorganic luminescent material preferably absorbs light in a region of from 300 nm to 1420 nm. Preferably, the maximum absorption peak is within the UV and/or visible and/or infrared region of the electromagnetic spectrum, preferably within the region of 300 nm to 1420 nm. Preferably, the line width of the absorption peak is 50 nm or more, preferably 100 nm or more, more preferably 150 nm or more, most preferably 200 nm or more. Line width is the width at half height of the absorption line in nm, when measured at 25° C. The greater wavelength preferably corresponds to an energy of at least 1.05 times the bandgap energy in the photovoltaic cell. Preferably, there is no or substantially no overlap of the absorption spectrum and the emission spectrum of the inorganic luminescent material. This has been found to reduce the re-absorption of photons emitted by the inorganic luminescent material. Preferably, the Stokes shift in the inorganic luminescent material is 50 nm or more, more preferably 80 nm or more, more preferably 100 nm or more.

The transparent matrix may be of any material known to the skilled person, for example, the transparent matrix may comprise a material selected from a glass and a transparent polymer. The transparent polymer may be selected from a poly(methyl methacrylate) polymer (PMMA, which typically has a refractive index of about 1.49) and a polycarbonate polymer (typical refractive index of about 1.58). The glass may be selected from any known transparent inorganic amorphous material, including, but not limited to, glasses comprising silicon dioxide and glasses selected from the albite type, crown type and flint type. Different glasses have different refractive indices and, if desired, the glass can be selected on the basis of its refractive index. For example, a glass of the albite type may have a refractive index of about 1.52. A glass of the crown type may have a refractive index of about 1.49 to 1.52. A glass of the flint type may have a refractive index of from about 1.58 to about 1.89, depending on its density and constituents, as would be appreciated by the skilled person.

A transparent matrix in the present context includes, but is not limited to, a material that can transmit light at least in a portion of the electromagnetic region in which the luminescent material absorbs light and at least in a portion of the electromagnetic region in which the luminescent material emits light. It preferably can transmit light at least in part across, optionally across the whole of, the region of 300 to 2000 nm. Optionally, the refractive index of the inorganic luminescent material is 93% to 107% of the refractive index of the transparent matrix, optionally 95% to 105% of the refractive index of the transparent matrix, optionally 98% to 102% of the refractive index of the transparent matrix. The present inventors have found that efficiency can be improved when the refractive index of the luminescent particles is the same as or substantially the same as that of the transparent matrix. This avoids scattering of light at the interface between the particles and the matrix. Transparent materials for use in or as the transparent matrix with a range of refractive indexes are known, and the selection of a suitable material is within the skills of the skilled person.

In a preferred embodiment, the transparent matrix comprises or is a non-crystalline material and the inorganic luminescent material comprises or is a crystalline material. It has been found that where a glass has been doped with luminescent inorganic ions, such that the ions are within an amorphous environment, they generally do not show efficient luminescence. In the present invention, it has been found that an inorganic crystalline material is preferred as the luminescent material as the efficiency of the luminescence is generally higher than in a non-crystalline material. An advantage of the transparent matrix comprising a non-crystalline material, e.g. an amorphous material comprising a glass or a polymer, within which particles of the crystalline material can be dispersed, is that the waveguide can be manufactured generally more efficiently than a transparent crystalline matrix, yet with a high luminescent efficiency.

The particles of the inorganic luminescent material may have cubic symmetry. The particles of the inorganic luminescent material may be of any appropriate size. The particles may have a volumetric mean diameter of from 10 nm to 2 mm, for example. When the refractive index of the particles of the inorganic luminescent material is the same or substantially the same as that of the matrix in which they are dispersed, the size of the particles is not restricted. The inorganic particles within the matrix may have a volumetric mean diameter of up to about 100 nm, preferably a volumetric mean diameter of up to about 50 nm. This is particularly preferred when the particles do not have cubic symmetry and/or do not have a refractive index that is the same or substantially the same as the transparent matrix, as it reduces the scattering of light. The volumetric mean diameter of the particles of the inorganic luminescent material can be determined according to established techniques and equipment known to the skilled person, e.g. using electron microscopical techniques or using a Malvern Nanosizer instrument (commercially available).

The particles of the inorganic luminescent material may be dispersed in the transparent matrix by any appropriate method. For example, the method may comprise providing a liquid precursor to the transparent matrix, dispersing the particles within the liquid precursor and solidifying the liquid precursor to form the transparent matrix in which the particles of inorganic luminescent material are dispersed. The liquid precursor may, for example, comprise or be a molten form of the material of the solid transparent matrix, and the particles of the inorganic luminescent material may be dispersed in the molten material, which is then solidified to form the transparent matrix in which the particles of inorganic luminescent material are dispersed. The liquid precursor may comprise a liquid carrier containing the material of the transparent matrix and the particles of the inorganic luminescent material and the liquid carrier may be removed to form the transparent matrix in which the particles of inorganic luminescent material are dispersed; the material of the transparent matrix and the particles of the inorganic luminescent material may be present in the liquid carrier as a solution and/or a suspension, for example. Alternatively, if the solid transparent matrix comprises a polymer, the liquid precursor may be a liquid containing an unpolymerised or incompletely polymerised precursor to the polymer and the particles of the inorganic luminescent material, and the unpolymerised or incompletely polymerised precursor may be polymerised or further polymerised to form the transparent matrix in which the particles of inorganic luminescent material are dispersed.

In an embodiment, the inorganic luminescent material comprises or is a line emitter. A line emitter is a species that emits with a very narrow emission line width. Line emitters include, but are not limited to, materials that have an emission line width of 20 nm or less, preferably 10 nm or less, most preferably 5 nm or less. Line width is the width at half height of the emission line in nm, when measured at 25° C.

Optionally, the line emitter emits light at a wavelength $\lambda^1$, the photovoltaic generator further comprises a light filter disposed on a side of the transparent matrix through which light enters the transparent matrix, the light filter selectively reflecting emitted light at the wavelength $\lambda^1$ back into the luminescent material and/or to the photovoltaic cell, but preferably allowing transmittance through the filter of light of wavelengths at which light will be absorbed by the luminescent material. The wavelength filter is preferably an interference filter. The use of a line emitter allows use of an interference filter that is relatively inexpensive, hence saving on the cost of manufacture of the photovoltaic device.

The inorganic luminescent material may comprise an inorganic fluorescent material or an inorganic phosphor, the inorganic phosphor being preferred. Inorganic phosphors, otherwise termed inorganic phosphorescent materials in the art, are known to the skilled person. They include inorganic luminescent materials that absorb light at a certain wavelength and then emit at another wavelength through a quantum mechanically forbidden electronic transition, for example a spin or parity forbidden transition. The persistence of the luminescence in phosphorescent materials will generally be for about 1 μsec or more. Nevertheless, in some materials, in which luminescence is due to allowed optical transitions, emission may also be slow, for example in many materials doped with $Eu^{2+}$ and/or $Yb^{2+}$. In some phosphorescent materials, the luminescence may persist for seconds or even minutes.

Phosphorescent materials are preferred over fluorescent materials, since they are far less likely to reabsorb photons emitted through luminescence of the material than a fluorescent material with comparable absorption and emission spectra. This will increase the efficiency of the photovoltaic generator.

The inorganic phosphor may be an inorganic material in which the absorption and emission occurs on the same ions in the material. The inorganic phosphor may be an inorganic material containing and/or doped with transition metal and/or rare earth ions. Preferably, the transition metal ions, on which absorption and emission occurs, are $d^3$ ions, i.e. ions, which have 3 electrons in their outer d-orbitals. Examples of $d^3$ ions include, but are not limited to, $V^{2+}$, $Cr^{3+}$, $Mn^{4+}$ and $Fe^{5+}$. The inorganic phosphor may comprise an inorganic host material that has been doped with an ion on which emission and absorption occurs, typically a single type of ion on which emission and absorption occurs. Examples of materials include, but are not limited to, $Al_2O_3$:Cr and $Mg_2TiO_4$:Mn, in which $Al_2O_3$ and $Mg_2TiO_4$ are the host materials and $Cr^{3+}$ and $Mn^{4+}$ are the ions on which emission and absorption occurs. Preferably, the crystal field acting on these emitting ions is not too small, as otherwise broad emission spectra will be encountered.

Optionally, when the emitting ions are within a host material, Dq/B for the emitting ions should be at least about 2.1 when CB value is 2.5, in which Dq is the crystal field strength parameter and B and C are Racah parameters for the emitting ions in the host material. Dq, B and C for an emitting ion within a host material are normally readily available in the literature and/or measurable using known techniques.

Inorganic phosphors such as those mentioned above have been found to be advantageous as they are able to absorb over a relatively broad range of frequencies, yet emit at a longer wavelength over a very narrow range (i.e. having a narrow line width). Additionally, for the $d^3$ ions, the absorption bands can vary depending on the host material into which they are doped, but the emission band is much less dependent on the host material. This allows the skilled person to adapt the device accordingly and to select the host material according to the desired absorption range. The amount (molar fraction) of the transition metal ions and/or rare earth ions in the host material is typically about 0.1 to 10 mole %. If the ions are doped into a material to replace other ions, 0.1 to 10 mole % of the replaced ions are the transition metal ions and/or rare earth ions.

The inorganic luminescent material may be an inorganic material in which the absorption and emission occurs on different species in the material. The inorganic luminescent material may comprise a first species that absorbs light in the UV and/or visible and/or infrared region of the electromagnetic spectrum, optionally in the region of 300 nm to 1420 nm, and a second species that emits light at a greater wavelength than the first species absorbs, and energy transfer occurs between the first and second species, such that the material absorbs light in the UV and/or visible and/or infrared region of the electromagnetic spectrum, optionally in the region of 300 nm to 1420 nm, and emits at the greater wavelength, and the light at the greater wavelength is at an appropriate energy to generate a voltage in the photovoltaic cell.

The inorganic luminescent material may be an inorganic material in which the absorption and emission occurs on different ions in the material. The inorganic luminescent material may comprise an inorganic host material that has been doped with a first ion on which absorption occurs and a second ion on which emission occurs. In such materials, an energy transfer from the first ion to the second ion will take place after the absorption of incident light by the first ion, such that the second ion is excited to a state that will allow it to emit light. The first ion is preferably an ion that absorbs in the UV and/or visible and/or infrared region of the electromagnetic spectrum, optionally in the region of 300 nm to 1420 nm. The first ion may be selected from $Ce^{3+}$, $Eu^{2+}$ and $Yb^{2+}$. The second ion may be a rare earth ion, which may be selected from $Pr^{3+}$, $Er^{3+}$, $Nd^{3+}$, $Ho^{3+}$, $Yb^{3+}$, $Tm^{3+}$, $Sm^{3+}$, $Dy^{3+}$, $Mn^{2+}$, $Yb^{2+}$ and $Eu^{2+}$. The second ion may be a transition metal ion, including, but not limited to $d^3$ transition metal ions, which may be selected from $V^{2+}$, $Cr^{3+}$, $Mn^{4+}$ and $Fe^{5+}$.

The emission of light on the second ion may be a forbidden transition, as described above; the inorganic luminescent material that comprises an inorganic host material that has been doped with a first ion on which absorption occurs and a second ion on which emission occurs may be an inorganic phosphorescent material. Such phosphorescent inorganic materials include, but are not limited to, $Gd_3Ga_5O_{12}$; Ce, Cr, in which $Gd_3Ga_5O_{12}$ is the host material, Ce in its cationic form is the first ion and Cr in its cationic form is the second ion. This material absorbs in the range of 300 to 500 nm (an allowed optical absorption by $Ce^{3+}$) and emits at 730 nm (through a transition on $Cr^{3+}$, this transition being a quantum mechanically forbidden transition). Such materials are advantageous, as re-absorption of emitted photons is reduced.

The first and second ions in the inorganic phosphor may be present in any suitable amount, depending on the desired levels of absorption and/or emission. The first ion may be present in the inorganic host material in an amount of from 0.5 to 5 mole %. The second ion may be present in the inorganic host material in an amount of from 0.5 to 5 mole %.

The emission of light on the second ion may be due an allowed electronic transition; the inorganic luminescent material that comprises an inorganic host material that has been doped with a first ion on which absorption occurs and a second ion on which emission occurs may be an inorganic fluorescent material. The second ion may be selected from $Eu^{2+}$ and $Yb^{2+}$. Suitable materials include, but are not limited to, $CaAlSiN_3$; Ce, Eu, in which $CaAlSiN_3$ is the host material, $Ce^{3+}$ is the first ion and $Eu^{2+}$ is the second ion. This material absorbs in the blue-green spectrum and emits in the range of 630 to 655 nm.

The first and second ions in the inorganic fluorescent material may be present in any suitable amount, depending on the desired levels of absorption and/or emission. The first ion may be present in the inorganic host material in an amount of from 0.5 to 5 mole %. The second ion is preferably present in the inorganic fluorescent material in an amount of 0.5 or less mole %, preferably 0.2 or less mole %, most preferably 0.1 or less mole %. The second ion is preferably present in the inorganic fluorescent material in an amount of 0.01 or more mole %. The present inventors have found that by reducing the amount of the second ion below the levels indicated above decreases the absorption of the emitted photons, which in turn increases the efficiency of the photovoltaic generator.

The inorganic luminescent material may comprise semiconductor containing particles that are of an appropriate size to allow them to fluoresce; such semiconductor containing particles will be termed quantum particles herein. The inorganic luminescent material may comprise quantum dots, quantum rods and quantum core/shell particles. Quantum dots, quantum rods and quantum core/shell particles are semiconductor containing particles that are of an appropriate size to allow them to fluoresce. Quantum rods are particles that are elongate in shape. Quantum core/shell particles are particles comprising a core of semiconductor material having a coating of a further material thereon, which may optionally coat the entire surface of the core; the further material may be a material selected from a semiconductor and/or dielectric material. The particles generally have a diameter of from 1 to 50 nm in size. The emission wavelength at which the particles will fluoresce is dependent on the nature of the semiconductor material and the size and shape of the particles and on the presence of a shell/coating surrounding the individual particles. The larger the particles, the lower the energy at which the particle will emit light when fluorescing. The inorganic luminescent material preferably comprises semiconductor containing particles that emit light when fluorescing having a photon energy that is above the band gap of the solar cell. Species such as quantum dots, quantum rods and quantum core/shell particles have been found to be advantageous, since they have a generally broad absorption spectrum, but a narrow emission spectrum.

The semiconductor containing particles may comprise particles comprising a semiconductor material selected from one or more of a group IV elemental semiconductor, such as silicon (Si) and germanium (Ge); group IV compound semiconductors, such as silicon germanide (SiGe); group III-V semiconductors, such as aluminium antimonide (AlSb), aluminium arsenide (AlAs), aluminium phosphide (AlP), boron phosphide (BP), boron arsenide (BAs), gallium antimonide (GaSb), gallium arsenide (GaAs), gallium phosphide (GaP), indium antimonide (InSb), indium arsenide (InAs), indium nitride (InN), indium phosphide (InP); III-V ternary semiconductor alloys, such as aluminium gallium arsenide (AlGaAs, AlxGa1-xAs), indium gallium arsenide (InGaAs, InxGa1-xAs), indium gallium phosphide (InGaP), aluminium indium arsenide (AlInAs), aluminium indium antimonide (AlInSb), gallium arsenide nitride (GaAsN), gallium arsenide phosphide (GaAsP), aluminium gallium phosphide (AlGaP), indium gallium nitride (InGaN), indium arsenide antimonide (InAsSb), indium gallium antimonide (InGaSb); III-V quaternary semiconductor alloys, such as aluminium gallium indium phosphide (AlGaInP, also InAlGaP, InGaAlP, AlInGaP), aluminium gallium arsenide phosphide (AlGaAsP), indium gallium arsenide phosphide (InGaAsP), aluminium indium arsenide phosphide (AlInAsP), aluminium gallium arsenide nitride (AlGaAsN), indium gallium arsenide nitride (InGaAsN), indium aluminium arsenide nitride (InAlAsN), gallium arsenide antimonide nitride (GaAsSbN); III-V quinary semiconductor alloys, such as gallium indium nitride arsenide antimonide (GaInNAsSb), gallium indium arsenide antimonide phosphide (GaInAsSbP); II-VI semiconductors, such as cadmium selenide (CdSe), cadmium sulfide (CdS), cadmium telluride (CdTe), zinc selenide (ZnSe), zinc sulfide (ZnS), zinc telluride (ZnTe); II-VI ternary alloy semiconductors, such as cadmium zinc telluride (CdZnTe, CZT), mercury cadmium telluride (HgCdTe), mercury zinc telluride (HgZnTe), mercury zinc selenide (HgZnSe); I-VII semiconductors, such as cuprous chloride (CuCl); IV-VI semiconductors, such as lead selenide (PbSe), lead sulfide (PbS), lead telluride (PbTe), tin sulfide (SnS), tin telluride (SnTe); IV-VI ternary semiconductors, such as lead tin telluride (PbSnTe), thallium tin telluride (Tl2SnTe5), thallium germanium telluride (Tl2GeTe5); V-VI semiconductors, such as bismuth telluride (Bi2Te3); II-V semiconductors, such as cadmium phosphide (Cd3P2), cadmium arsenide (Cd3As2), cadmium antimonide (Cd3Sb2), zinc phosphide (Zn3P2), zinc arsenide (Zn3As2), zinc antimonide (Zn3Sb2); and others including lead(II) iodide (PbI2), gallium selenide (GaSe), tin sulfide (SnS), bismuth sulfide (Bi2S3); copper indium gallium selenide (CIGS); platinum silicide (PtSi), bismuth(III) iodide (BiI3), mercury(II) iodide (HgI2), thallium(I) bromide (TlBr), uranium dioxide (UO2) and uranium trioxide (UO3).

In a preferred embodiment, the quantum particles, such as quantum dots, quantum rods and quantum core/shell particles, comprise a semiconductor material with an indirect bandgap, including, but not limited to, Si and GaP. Such materials have been found to be less likely to reabsorb emitted photons.

Semiconductor containing particles that are of an appropriate size to allow them to fluoresce, such as quantum dots, quantum rods and quantum core/shell particles may be made by any method known to the skilled person, including, but not limited to, wet chemical methods, (MO)CVD methods and laser ablation methods.

In another preferred embodiment quantum core/shell particles are used. As mentioned above, quantum core/shell particles are particles comprising a core of semiconductor material having a coating of a further material thereon, which may optionally coat the entire surface of the core; the further material may be a material selected from a semiconductor and/or dielectric material, and if the further material comprises a semiconductor material, it may be as described herein. Emission can take place via the interface between the core and its coating involving charges of one kind in the core and of the other kind in the shell, which results in a larger Stokes Shift. CdTe/CdSe quantum core/shell particles show this effect. Accordingly, the quantum core/shell particles may comprise particles comprising a core of CdTe having a coating of CdSe thereon.

In an embodiment, the quantum core/shell particles may be elongate, and may comprise quantum rods. CdSe/CdS quantum rods show less spectral overlap than spherical systems; this is very beneficial in reducing re-absorption losses. Accordingly, the quantum core/shell particles may comprise elongate particles, optionally quantum rods, comprising a core of CdSe having a coating of CdS thereon.

The inorganic luminescent material may comprise a first species that absorbs light in the UV and/or visible and/or infrared region of the electromagnetic spectrum, optionally in the region of 300 nm to 1420 nm, and a second species that emits light at a greater wavelength than the first species absorbs, and energy transfer occurs between the first and second species, such that the material absorbs light in the UV and/or visible and/or infrared region of the electromagnetic spectrum, optionally in the region of 300 nm to 1420 nm, and emits at the greater wavelength, and the light at the greater wavelength is at an appropriate energy to generate a voltage in the photovoltaic cell, and the first and second species may independently comprise quantum particles, and the quantum particles are optionally selected from quantum dots, quantum rods and quantum core/shell particles.

The inorganic luminescent material may comprise a first set of quantum particles that absorb light in the UV and/or visible and/or infrared region of the electromagnetic spectrum, optionally in the region of 300 nm to 1420 nm, and a second set of quantum particles that emit light at a greater wavelength than the first set of quantum particles absorb, and energy transfer occurs between the first and second sets of quantum particles, such that the material absorbs light in the UV and/or visible and/or infrared region of the electromagnetic spectrum, optionally in the region of 300 nm to 1420 nm, and emits at the greater wavelength, and the light at the greater wavelength is at an appropriate energy to generate a voltage in the photovoltaic cell.

The inorganic luminescent material may comprise a mixture of quantum particles, which may be, for example have different sizes, shapes and/or comprise different materials. The inorganic luminescent material may, for example, comprise a mixture of quantum particles, optionally selected from quantum dots, quantum rods and core/shell systems, having large and small sizes. For example, the inorganic luminescent material may comprise and/or have been formed from a first set of quantum particles of an appropriate size to absorb light in the UV and/or visible and/or infrared region of the electromagnetic spectrum, optionally in the region of 300 nm to 1420 nm, and the second set of quantum particles of an appropriate size, such that they emits at the greater wavelength that the first set of quantum particles absorb, and energy transfer occurs between the first and second set of quantum particles. Preferably, the first set of quantum particles will have smaller volumetric mean diameter than the second set of quantum particles and the first set of quantum particles will be present in the inorganic luminescent material in a greater proportion than the second set of quantum particles. The inorganic luminescent material that comprises first and second sets of quantum particles may have a Stokes shift of 50 nm or more, more preferably 80 nm or more, more preferably 100 nm or more.

In a preferred embodiment, the second set of quantum particles has a volumetric mean diameter equal to or larger than the Bohr-radius of the exciton in the semiconductor material from which they are made and the first set of quantum particles has a volumetric mean diameter that is less than the Bohr-radius of the exciton in the semiconductor material from which they are made. The particle sizes and hence the volumetric mean diameter can e.g. be measured using the XRD peak width, using electron microscopy or using the Malvern nanosizer instrument. The Bohr-radius of the exciton in a semiconductor material depends on the specific material and is generally between 1 and 10 nm. It is determined by the effective masses of the charge carriers in the semiconductor and the dielectric constant of the semiconductor.

The volume ratio (volume of second set of quantum particles:volume of all quantum particles) in the luminescent material is preferably 1:100 or less, preferably 1:200 or less. A small amount of emitting quantum particles, relative to the absorbing quantum particles has been found to be advantageous in that the re-absorption of emitted photons has been found to be reduced.

In another embodiment, two or more different types of quantum dots and/or quantum rods and/or core/shell systems are used. The quantum unit that generates the radiation to be received by the photovoltaic element should be present in small amounts as specified above.

The quantum particles may be dispersed in the transparent matrix using any known technique, such as those mentioned above employing a liquid precursor. In a preferred method, the liquid precursor is a liquid containing an unpolymerised or incompletely polymerised precursor to a polymer and the quantum particles, and the unpolymerised or incompletely polymerised precursor is polymerised or further polymerised to form the transparent matrix in which the quantum particles are dispersed. For example, the polymer may comprise PMMA, and the liquid precursor comprises a solvent, MMA, and the quantum particles.

A dispersion of quantum particles in PMMA may be made as follows. Under vigorous stirring, a suitable amount of quantum particle colloidal solution (the nanoparticles being optionally capped using TOP/TOPO procedures, the solvent being optionally toluene) can be added into distilled MMA (methyl methacrylate) and a suitable radical initiator (e.g. azobisisobutyronitrile (AIBN) of 0.05-0.2% by weight). The MMA/quantum particle dispersion can then be heated, for example in a thermostatic water bath at about 90° C. for 20 min., until the dispersion has a suitable viscosity to be cast (prepolymerization), and then the dispersion is cast in suitable moulds. The moulds can be further heated, for example in an oven at 60° C., for postpolymerization, to form the dispersion of quantum particles in PMMA. The plates can be planarised and polished.

The present inventors have found that the efficiency of the photovoltaic generator will depend on a balance of factors, including, but not limited to, the absorption and emission wavelengths of the luminescent material, the amount of re-absorption that occurs in the luminescent material and the band gap in the photovoltaic cell. The inorganic luminescent material preferably emits light having an energy (at the maximum intensity of emission) of at least 1.05 times the energy of the band gap in the photovoltaic cell. To maximise efficiency, the luminescent material should preferably absorb across a wide range of wavelengths. It has been found that it should absorb at wavelengths above about 300 nm. As photon flux in sunlight rapidly decreases for photons with energies above about 1 eV (about 1420 nm), the inorganic luminescent material need only absorb up to wavelengths of about 1420 nm. However, to minimise re-absorption, the overlap between the absorption spectrum and emission spectrum should be as small as possible, which generally corresponds to a large Stokes shift. Preferably, the inorganic luminescent material has a high wavelength absorption limit of $\lambda^a$, where $\lambda^a$ is a wavelength that corresponds to an energy that is 20% or more than the energy of the band gap in the photovoltaic cell (both energies being measured in the same units, such as eV).

Table I below shows a range of semiconductor materials that may be used in the photovoltaic cell, their band gaps (given in nm), the preferred absorption and emission ranges of the luminescent material that should be used with the semiconductor materials, and the preferred emitting ions that should be used with the semiconductor materials.

While semiconductor materials having high energy bandgaps will generally generate a higher voltage than those with low energy band gaps, they have the disadvantage that the breadth of the absorption spectrum that can be used in the associated luminescent material is smaller than for semiconductor materials having low energy band gaps. In other words, for semiconductor materials with high energy band gaps, the amount of the electromagnetic spectrum that can be used for absorption in the luminescent material will be smaller than for semiconductor materials with low energy band gaps, hence the percentage of incident photons converted to electricity will be smaller, and efficiency may be lower. In Table I, it can be seen that CdTe and GaInP have a larger energy bandgap than the other semiconductor materials shown (corresponding to a shorter bandgap wavelength than the other materials), but that the breadth of the absorption spectrum of the associated luminescent material that can be used with CdTe and GaInP is relatively small compared to the other semiconductor materials. The present inventors have found that the bandgap of the material in the photovoltaic cell is preferably at least 750 nm (or about a maximum bandgap energy of 1.65 eV). Accordingly, the photovoltaic cell preferably comprises a semiconductor material selected from Ge, GaInAs, $CuInSe_2$, Si and GaAs.

TABLE I

| Semiconductor material in photovoltaic cell | Bandgap (nm) of the semiconductor material | Preferred absorption range (nm) of the luminescent material | Preferred emission range (nm) of the luminescent material | Emitting ions, materials |
|---|---|---|---|---|
| Ge | 1770 | 300-1420 | 1180-1680 | $Er^{3+}$ |
| GaInAs | 1420 | 300-990 | 1120-1180 | |
| $CuInSe_2$ | 1180 | 300-950 | 1075-1120 | |
| Si | 1125 | 300-900 | 840-1075 | $Cr^{3+}, Nd^{3+}, Yb^{3+}$ |
| GaAs | 885 | 300-710 | 675-840 | $Cr^{3+}, Fe^{3+}$ |
| CdTe | 710 | 300-570 | 620-675 | $Mn^{4+}, Eu^{2+}$ |
| GaInP | 650 | 300-520 | −620 | $Mn^{2+}, Mn^{4+}, Eu^{2+}$ |

Table I above shows combinations of semiconductor materials and emitting ions that would increase the efficiency of a device, generally for a waveguide that contains only one type of luminescent material and/or emitting species. The waveguide and/or device may comprise a plurality of types of luminescent material and/or emitting species.

Construction of the Photovoltaic Generator

As discussed above, the present invention provides a photovoltaic generator comprising a photovoltaic cell and a waveguide comprising a transparent matrix having (i) particles of an inorganic luminescent material dispersed therein and/or (ii) an inorganic luminescent material is disposed at at least one side thereof, wherein the waveguide is associated with the photovoltaic cell, such that, in use, at least some of the light emitted from the luminescent material passes into the photovoltaic cell to generate a voltage in the cell.

The waveguide and/or the transparent matrix may have a plurality of sides. In an embodiment, a photovoltaic cell is disposed on at least one side of the waveguide. Preferably, at least one photovoltaic cell is disposed on each of two sides of the waveguide. The transparent matrix may have a first side through which light enters the transparent matrix, and a side opposite the first side, with the remaining side or sides of the transparent matrix being termed lateral side or sides. The one or more photovoltaic cells are preferably located on the lateral side or sides.

In an embodiment, a light filter is disposed on at least one side of the waveguide or transparent matrix. The light filter will preferably allow transmission of light that will be absorbed by the luminescent material but will reflect light that is emitted by the luminescent material. A suitable filter is an interference filter. Such filters are known to the skilled person and consist of layers of materials with alternating large and small values of refractive index. Preferred interference filters include, but are not limited to, filters comprising alternating layers of $SiO_2$ (refractive index=1.46) and $TiO_2$ (refractive index=2.42) or $Ta_2O_5$ (refractive index=2.17), or filters consisting of alternating organic layers of low and high refractive index.

Preferably, reflective materials that reflect both light that will be absorbed and light that is emitted are disposed on sides or parts of sides of the waveguide other than the sides or part of sides on which the photovoltaic cell is disposed and through which light enters the transparent matrix. The reflective material may comprise, for example, a white reflective material and/or a mirror. The white reflective material may comprise a white granular material, for example containing $TiO_2$ particles. Suitable materials are known to the skilled person.

In an embodiment, particles of the inorganic luminescent material are dispersed in the transparent matrix and the transparent matrix has a plurality of sides, wherein disposed at at least one side of the matrix is a photovoltaic cell, disposed at at least one side is a light filter, the remaining sides having disposed thereon reflective materials that reflect both light that will be absorbed and light that is emitted by the inorganic luminescent material.

In an embodiment, the inorganic luminescent material is disposed at a side of the transparent matrix. A layer comprising, consisting essentially of or consisting of the inorganic luminescent material may be disposed at a side of the transparent matrix. If the layer consists essentially of the inorganic luminescent material, preferably less than 5 wt %, more preferably less than 2 wt %, most preferably less than 1 wt % of other materials are present in the layer. The inorganic luminescent material may be disposed on a surface of the transparent matrix, optionally as a layer or incorporated in a layer or film. The side of the transparent matrix on which the luminescent material is disposed is preferably opposite the side through which light enters the waveguide, and preferably one or more photovoltaic cells are disposed on one or more of the lateral sides. The layer of the inorganic luminescent material will preferably have a sufficient thickness, such that at least 90% of emitted photos in the luminescent material passes back into the waveguide. A reflective material may be disposed on the exterior side of the inorganic luminescent material, to assist reflectance of emitted photos back into the waveguide.

In an embodiment, the photovoltaic generator further comprises a diffractive element, which will separate light into different wavelengths. The diffractive element may be associated with the waveguide such that light incident on the diffractive element is separated into different wavelengths before entering the waveguide. This is advantageous when more than one kind of photovoltaic cell is used. In this way, the photon energy of the light can be optimally adapted to the photovoltaic cell used. Light with higher photon energy will then result in higher voltages generated by the corresponding photovoltaic elements.

In an embodiment, the device may comprise a tandem solar cell system, in which a series of different solar cells are included in the device. The different solar cells preferably comprise materials with different band gaps. The different solar cells are preferably located on a lateral side of the device such that, in the direction of light propagation, i.e. in the direction away from the side through which light enters the waveguide, the band gaps of solar cells decrease.

The waveguide and/or transparent matrix may be generally cuboid in shape. It may have a surface for the admission of light, optionally having a light filter thereon, a surface opposite the surface for the admission of light, with the remaining sides being termed lateral sides. The distance between the surface for the admission of light and its opposite surface is preferably less than either of the distances between opposing lateral sides. A light filter is preferably located on the surface for the admission of light. Preferably, one or more photovoltaic cells are located on one or more of the lateral sides. Reflective materials that reflect both light that will be absorbed and light that is emitted are preferably disposed on the remaining sides of the waveguide.

Figure 1A:
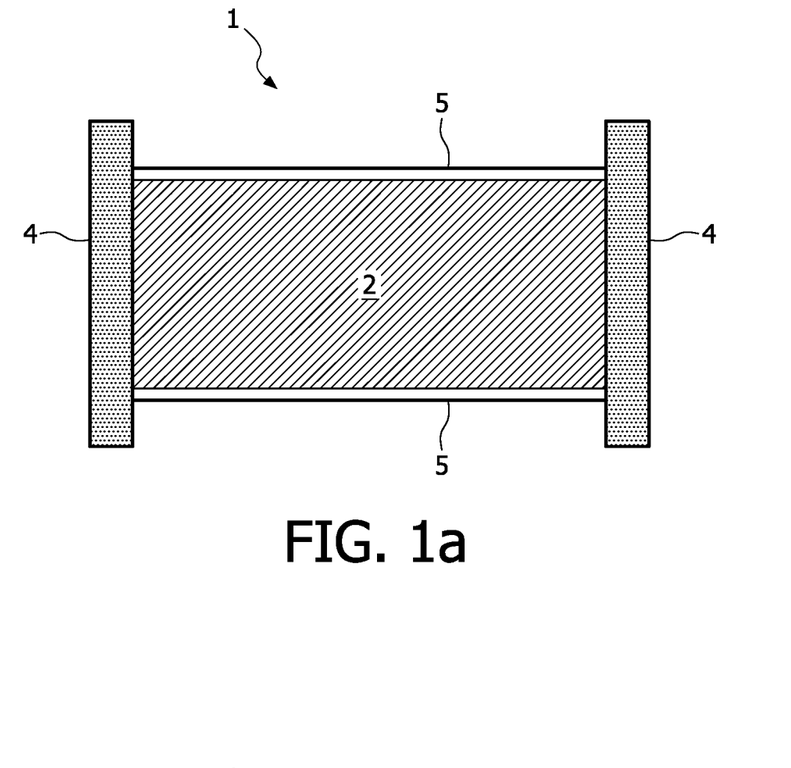
FIGS. 1a and 1b show an embodiment of a photovoltaic generator of the present invention, in which particles of an inorganic luminescent material are dispersed in a transparent matrix.
Figure 1B:
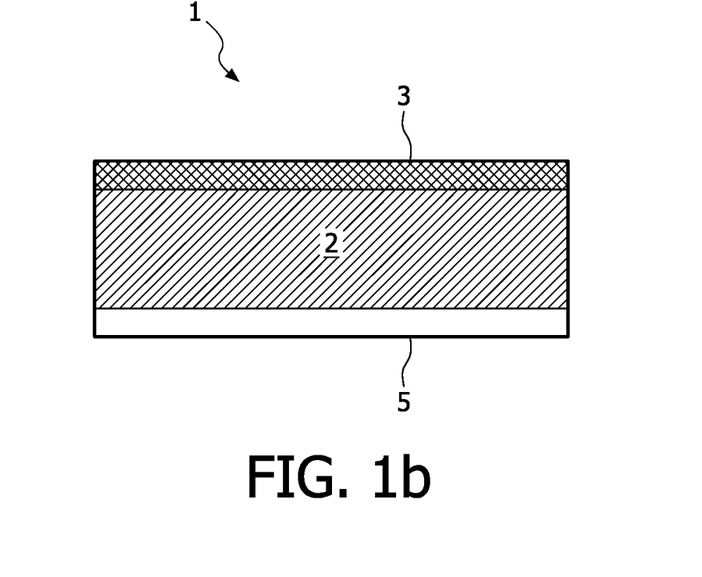

FIGS. 1a and 1b show an embodiment of a photovoltaic generator 1 of the present invention. The transparent matrix 2 of the waveguide of the embodiment is cuboid and can be considered to have a top surface, four lateral surfaces and a bottom surface. FIG. 1a shows a top view of the photovoltaic generator 1, and FIG. 1b shows a side view of the photovoltaic generator 1. Particles of an inorganic luminescent material (not shown) are dispersed in the transparent matrix of the waveguide 2. An interference filter 3 (not shown in FIG. 1a, shown in FIG. 1b) is disposed on the top surface of the transparent waveguide, and photovoltaic cells 4 are disposed on two opposing lateral surfaces of the waveguide. White reflective materials 5 are disposed on the remaining surfaces of the waveguide.

Figure 2A:
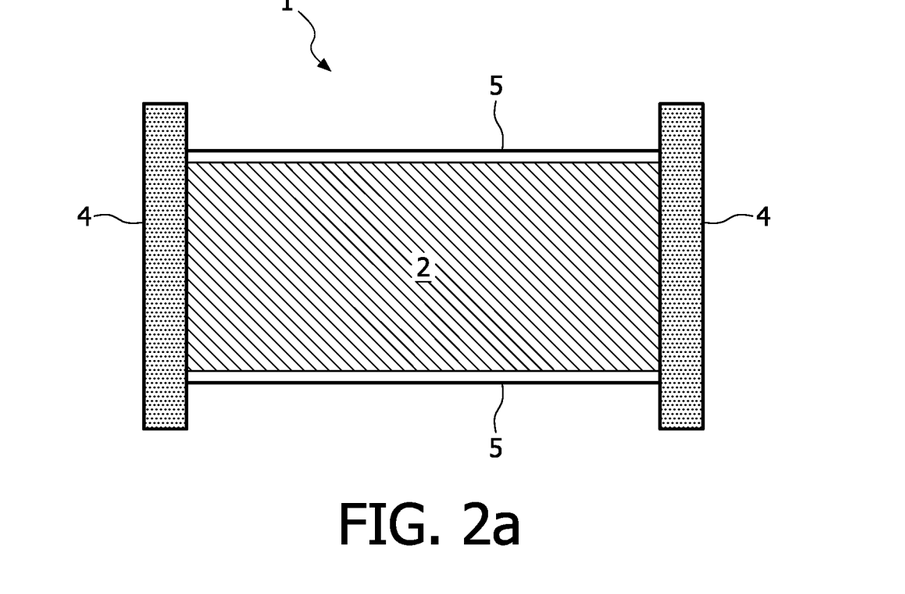
FIGS. 2a and 2b show an embodiment of a photovoltaic generator of the present invention, in which a layer comprising an inorganic luminescent material is disposed at a side of the transparent matrix.
Figure 2B:
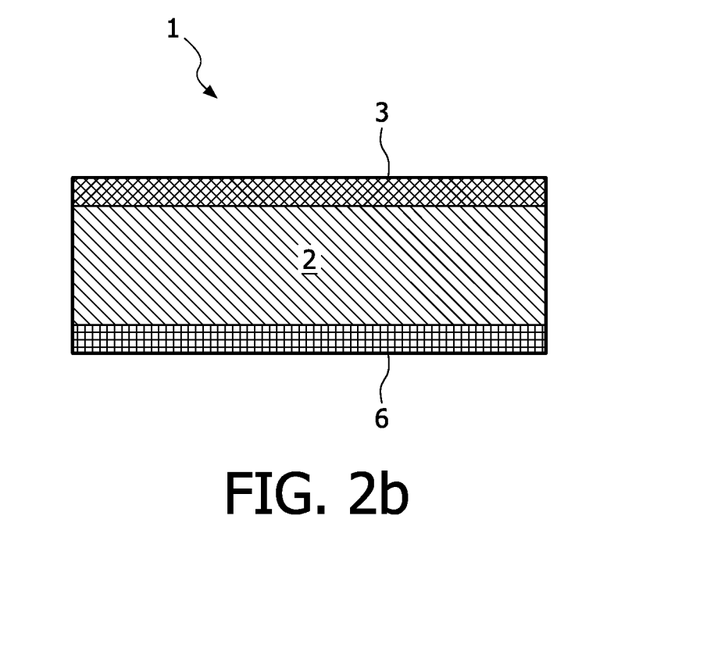

FIGS. 2a and 2b show an embodiment of a photovoltaic generator 1 of the present invention. The waveguide of the embodiment is cuboid and can be considered to have a top surface, four lateral surfaces and a bottom surface. FIG. 2a shows a top view of the photovoltaic generator 1, and FIG. 2b shows a side view of the photovoltaic generator 1. A layer of inorganic luminescent material 6 is disposed on the bottom surface of the transparent matrix of the waveguide. An interference filter 3 (not shown in FIG. 2a, shown in FIG. 2b) is disposed on the top surface of the transparent waveguide, and photovoltaic cells 4 are disposed on two opposing lateral surfaces of the waveguide. White reflective materials 5 are disposed on the remaining surfaces of the waveguide.

Figure 3:
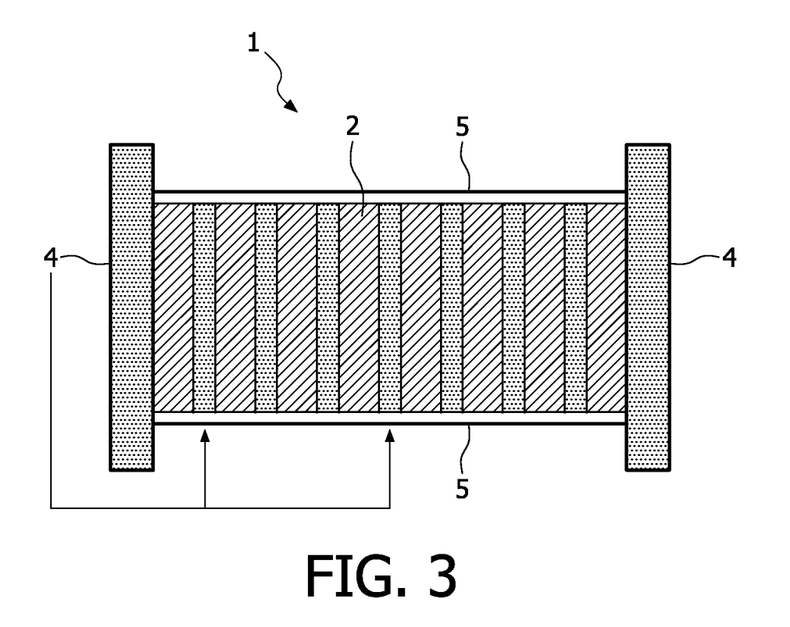
FIG. 3 shows an embodiment of a tandem photovoltaic generator of the present invention comprising a plurality of transparent matrices and adjoining parallel photovoltaic cells. A layer comprising an inorganic luminescent material is disposed at a side of the transparent matrices.

FIG. 3 shows an embodiment of a tandem photovoltaic generator 1 of the present invention. The generator of the embodiment is cuboid and can be considered to have a top surface, four lateral surfaces and a bottom surface. FIG. 3 shows a top view of the photovoltaic generator 1. The generator comprises a number of parallel photovoltaic cells 4, and disposed between each pair of cells 4 is a transparent matrix 2. On the bottom surface of each transparent matrix is a layer of inorganic luminescent material (not shown). An interference filter (not shown) is disposed on the top surface each of the transparent matrices. White reflective materials are disposed on the remaining surfaces of the transparent matrices.

The invention claimed is:

1. A photovoltaic generator comprising
a photovoltaic cell; and
a waveguide comprising a transparent matrix having particles of an inorganic luminescent material dispersed therein or an inorganic luminescent material disposed at one side thereof, wherein the waveguide is associated with the photovoltaic cell such that at least some of the light emitted from the luminescent material passes into the photovoltaic cell to generate a voltage in the cell;
wherein the inorganic luminescent material comprises a first species that absorbs light in the region of 300 nm to 1420 nm, and a second species that emits light at a greater wavelength than the first species absorbs, and energy transfer occurs between the first and second species, such that the inorganic luminescent material absorbs light in the region of 300 nm to 1420 nm, and emits at the greater wavelength, and the light at the greater wavelength, when passed from the waveguide into the photovoltaic cell, is at an appropriate energy to generate the voltage in the photovoltaic cell, an absorption spectrum of the first species has substantially no overlap with an emission spectrum for the second species;
wherein the first species are formed by a first set of semiconductor containing quantum particles and the second species are formed by a second set of semiconductor containing quantum particles, the second set of quantum particles having a volumetric mean diameter equal to or larger than a Bohr-radius of an exciton in the semiconductor material from which the second set is made and the first set of quantum particles having a volumetric mean diameter that is less than a Bohr-radius of an exciton in the semiconductor material from which the first set is made; and
wherein a greater number of the first species of said quantum particles is present in the inorganic luminescent material relative to a number of the second species of said quantum particles for reducing re-absorption of emitted light.

2. The photovoltaic generator according to claim 1, wherein the inorganic luminescent material has an absorption line width of 50 nm or more, an emission line width of 20 nm or less and a Stokes shift of 50 nm or more.

3. The photovoltaic generator according to claim 1, wherein the inorganic luminescent material has an absorption line width of 100 nm or more, an emission line width of 10 nm or less and a Stokes shift of 100 nm or more.

4. The photovoltaic generator according to claim 2, wherein the waveguide further comprises an interference filter disposed at at least one side of the transparent matrix, the interference filter allowing transmission of light into the waveguide within the electromagnetic region that is absorbed by the inorganic luminescent material and selectively reflecting light within the electromagnetic region that is emitted from the inorganic luminescent material.

5. The photovoltaic generator according to claim 1, wherein the transparent matrix comprises a non-crystalline material and the inorganic luminescent material comprises a crystalline material.

6. A photovoltaic generator (1) according to claim 1, wherein the inorganic luminescent material comprises an inorganic phosphor.

7. A photovoltaic generator (1) according to claim 6, wherein the inorganic phosphor comprises an inorganic host material containing first and second species, wherein the first species is an ion selected from $Ce^{3+}$, $Eu^{2+}$ or $Yb^{2+}$ and the second species is an ion selected from a rare earth ion and a transition metal ion.

8. A photovoltaic generator (1) according to claim 7, wherein the inorganic phosphor comprises $Gd_3Ga_5O_{12}$; Ce, Cr.

9. The photovoltaic generator according to claim 1, wherein the inorganic luminescent material comprises an inorganic fluorescent material.

10. The photovoltaic generator according to claim 9, wherein the inorganic fluorescent material comprises an inorganic host material containing first and second species, the concentration of the first species in the inorganic host material is greater than the concentration of the second species and the second species is present in the inorganic host material in a concentration of 0.5 or less mole %.

11. The photovoltaic generator according to claim 9, wherein the inorganic fluorescent material comprises $CaAlSiN_3$; Ce, Eu.

12. The photovoltaic generator according to claim 1, wherein the first and second species comprise independently a species selected from quantum dots, quantum rods and quantum core/shell particles.

13. A waveguide for use in a photovoltaic generator having a photovoltaic cell coupled to the waveguide, the waveguide comprising a transparent matrix having particles of an inorganic luminescent material dispersed therein or an inorganic luminescent material disposed at one side thereof;
the inorganic luminescent material comprising a first species that absorbs light in the region of 300 nm to 1420 nm, and a second species that emits light at a greater wavelength than the first species absorbs, and energy transfer occurs between the first and second species, such that the inorganic luminescent material absorbs light in the region of 300 nm to 1420 nm, and emits at the greater wavelength, and the light at the greater wavelength is at an appropriate energy to generate a voltage in the photovoltaic cell, an absorption spectrum of the first species have substantially no overlap with an emission spectrum for the second species;
the first species being formed by a first set of semiconductor containing quantum particles and the second species being formed by a second set of semiconductor containing quantum particles, the second set of quantum particles having a volumetric mean diameter equal to or larger than a Bohr-radius of an exciton in the semiconductor material from which the second set is made and the first set of quantum particles having a volumetric mean diameter that is less than a Bohr-radius of an exciton in the semiconductor material from which the first set is made; and
wherein a greater number of the first species of said quantum particles is present in the inorganic luminescent material relative to a number of the second species of said quantum particles for reducing re-absorption of emitted light.

14. The photovoltaic generator defined in claim 1, wherein a volume ratio of the first and second species of said quantum particles present in the inorganic luminescent material is less than or equal to 1:100, and wherein said volume ratio is realized as a ratio of a volume of the second species of said quantum particles present in the inorganic luminescent material with respect to a volume of all species of said quantum particles present in the inorganic luminescent material.

15. A photovoltaic generator comprising
a photovoltaic cell; and
a waveguide comprising a transparent matrix having particles of an inorganic luminescent material dispersed therein or an inorganic luminescent material disposed at one side thereof, wherein the waveguide is associated with the photovoltaic cell such that at least some of the light emitted from the luminescent material passes into the photovoltaic cell to generate a voltage in the cell;
wherein the inorganic luminescent material comprises a first species that absorbs light in the region of 300 nm to 1420 nm, and a second species that emits light at a greater wavelength than the first species absorbs, and energy transfer occurs between the first and second species, such that the inorganic luminescent material absorbs light in the region of 300 nm to 1420 nm, and emits at the greater wavelength, and the light at the greater wavelength, when passed from the waveguide into the photovoltaic cell, is at an appropriate energy to generate the voltage in the photovoltaic cell;
wherein the first species are formed by a first set of semiconductor containing quantum particles and the second species are formed by a second set of semiconductor containing quantum particles, the second set of quantum particles having a volumetric mean diameter equal to or larger than a Bohr-radius of an exciton in the semiconductor material from which the second set is made and the first set of quantum particles having a volumetric mean diameter that is less than a Bohr-radius of an exciton in the semiconductor material from which the first set is made;
wherein the inorganic luminescent material comprises an inorganic fluorescent material; and
wherein the inorganic fluorescent material comprises an inorganic host material containing first and second species, the concentration of the first species in the inorganic host material is greater than the concentration of the second species and the second species is present in the inorganic host material in a concentration of 0.5 or less mole %.

16. A photovoltaic generator according to claim 15, wherein the inorganic fluorescent material comprises $CaAlSiN_3$; Ce, Eu.

* * * * *